(12) United States Patent
Liu (10) Patent No.: US 11,569,149 B1
(45) Date of Patent: Jan. 31, 2023

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Chih-Cheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/662,737

(22) Filed: May 10, 2022

Related U.S. Application Data

(63) Continuation of application No. PCT/CN2022/076466, filed on Feb. 16, 2022.

(30) Foreign Application Priority Data

Jul. 9, 2021 (CN) .......................... 202110779490.X (51) Int. Cl.
*H01L 23/48* (2006.01)
*H01L 23/00* (2006.01)
*H01L 21/768* (2006.01)
*H01L 25/065* (2006.01)

(52) U.S. Cl.
CPC ...... *H01L 23/481* (2013.01); *H01L 21/76816* (2013.01); *H01L 21/76843* (2013.01); *H01L 21/76898* (2013.01); *H01L 24/32* (2013.01); *H01L 25/0657* (2013.01); *H01L 2224/32146* (2013.01); *H01L 2225/06524* (2013.01); *H01L 2225/06544* (2013.01)

(58) Field of Classification Search
CPC ............. H01L 23/481; H01L 21/76816; H01L 21/76843; H01L 21/76898; H01L 24/32; H01L 25/0657; H01L 2224/32146; H01L 2225/06524; H01L 2225/06544
See application file for complete search history.

(56) References Cited

U.S. PATENT DOCUMENTS

| 10,629,568 | B2 | 4/2020 | Ho et al. |
| 2016/0020170 | A1* | 1/2016 | Ho .......................... H01L 24/02 257/774 |
| 2018/0068984 | A1 | 3/2018 | Beyne et al. |
| 2018/0240859 | A1 | 8/2018 | Yang |

FOREIGN PATENT DOCUMENTS

| CN | 101533811 B | 10/2010 |
| CN | 105321903 A | 2/2016 |
| CN | 107316855 A | 11/2017 |

OTHER PUBLICATIONS

International Search Report cited in PCT/CN2022/076466 dated Apr. 25, 2022, 9 pages.
Written Opinion cited in PCT/CN2022/076466 dated Apr. 25, 2022, 7 pages.

* cited by examiner

*Primary Examiner* — Karen Kusumakar
(74) *Attorney, Agent, or Firm* — Cooper Legal Group, LLC (57) ABSTRACT

The present application provides a semiconductor structure and a manufacturing method thereof. The manufacturing method includes: providing a stacked structure, the stacked structure includes a first chip and a second chip; forming a through silicon via (TSV) in the stacked structure, the TSV includes a first part and a second part communicating with the first part, a sidewall of the first part is a vertical sidewall, and a sidewall of the second part is an inclined sidewall; forming an insulating layer on the sidewall of the first part; and forming a conductive layer in the TSV.

15 Claims, 6 Drawing Sheets

SEMICONDUCTOR STRUCTURE AND MANUFACTURING METHOD THEREOF

CROSS-REFERENCE TO RELATED APPLICATIONS

The present application is a continuation application of International Patent Application No. PCT/CN2022/076466, titled "SEMICONDUCTOR STRUCTURE AND MANUFACTURING METHOD THEREOF" and filed on Feb. 16, 2022, which claims the priority to Chinese Patent Application No. 202110779490.X, titled "SEMICONDUCTOR STRUCTURE AND MANUFACTURING METHOD THEREOF" and filed with China National Intellectual Property Administration (CNIPA) on Jul. 9, 2021. The entire contents of International Patent Application No. PCT/CN2022/076466 and Chinese Patent Application No. 202110779490.X are incorporated herein by reference.

TECHNICAL FIELD

The present application relates to the technical field of integrated circuits (ICs), and in particular to a semiconductor structure and a manufacturing method thereof.

BACKGROUND

The through silicon via (TSV) technology is a high-density packaging technology, and a fourth packaging technology as a promising replacement for mature wire bonding. The TSV technology implements the vertical electrical interconnection by filling conductive materials such as copper, tungsten and polycrystalline silicon. It can transmit a signal from one side of the chip to the other side of the chip and implement three-dimensional (3D) integration for multiple layers of chips in combination with chip stacking. The TSV technology is an important development trend of the semiconductors in the future. Through the vertical interconnection, it can effectively shorten the interconnecting line between chips and reduce the signal delay to achieve the better signal transmission performance, higher working frequency, wider broadband and higher device integration of the electronic system.

A TSV process mainly includes deep silicon etching for forming microholes, deposition of an insulating layer/a barrier layer/a seed layer, deep hole filling, chemical-mechanical polishing (CMP), thinning, pad manufacturing, re-distribution line manufacturing, etc. The conventional TSV process is implemented by forming a TSV in a front side of the chip, establishing metal interconnection at the front side of the chip to form electrical connection, thinning the semiconductor chip, and leading out an electrode from a back side of the chip.

However, for the conventional TSV process in which the TSV is only formed in one chip, when two or more chips are bonded together, adjacent chips are connected electrically by an additional conductive structure (such as a solder ball or a conductive bump) to make the structure and manufacturing process more complicated.

SUMMARY

According to a first aspect, the present application provides a manufacturing method of a semiconductor structure, including:

providing a stacked structure, where the stacked structure includes a first chip and a second chip, the second chip is bonded onto the first chip in a face-to-face (F2F) manner, and the first chip and the second chip each include a substrate, a dielectric layer on the substrate and a metal layer in the dielectric layer;

forming a TSV in the stacked structure, where the TSV includes a first part and a second part communicating with the first part; the first part penetrates through the substrate of the second chip; a sidewall of the first part is a vertical sidewall; the second part penetrates through the metal layer of the second chip and at least a part of the metal layer in the first chip; a sidewall of the second part is an inclined sidewall; and a bottom of the second part is narrower than a top of the second part;

forming an insulating layer on the sidewall of the first part; and forming a conductive layer in the TSV, the conductive layer being electrically connected to the penetrated metal layer in each of the first chip and the second chip.

The present application further provides a semiconductor structure, including: a stacked structure, where the stacked structure includes a first chip and a second chip, the second chip is bonded onto the first chip in an F2F manner, and the first chip and the second chip each include a substrate, a dielectric layer on the substrate and a metal layer in the dielectric layer;

a TSV, where the TSV includes a first part and a second part communicating with the first part; the first part penetrates through the substrate of the second chip; a sidewall of the first part is a vertical sidewall; the second part penetrates through the metal layer of the second chip and at least a part of the metal layer in the first chip; a sidewall of the second part is an inclined sidewall; and a bottom of the second part is narrower than a top of the second part;

an insulating layer, located on the sidewall of the first part; and a conductive layer, located in the TSV and filling up the TSV, the conductive layer being electrically connected to the penetrated metal layer in each of the first chip and the second chip.

BRIEF DESCRIPTION OF THE DRAWINGS

To describe the technical solutions in the embodiments of the present application or in the conventional art more clearly, the following briefly describes the accompanying drawings required for describing the embodiments or the conventional art. Apparently, the accompanying drawings in the following description show merely some embodiments of the present application, and those of ordinary skill in the art may still derive other accompanying drawings from these accompanying drawings without creative efforts.

DETAILED DESCRIPTION

To facilitate the understanding of the present application, the present application will be described more completely below with reference to the accompanying drawings. Preferred embodiments of the present application are shown in the accompanying drawings. However, the present application may be embodied in various forms without being limited to the embodiments described herein. On the contrary, these embodiments are provided to make the present application more thorough and comprehensive.

Unless otherwise defined, all technical and scientific terms used herein have the same meaning as commonly understood by those skilled in the technical field of the present application. The terms used in the specification of the present application are merely for the purpose of describing specific embodiments, rather than to limit the present application.

It should be understood that when an element or a layer is described as "being on", "being adjacent to", "being connected to" or "being coupled to" another element or layer, it can be on, adjacent to, connected to, or coupled to the another element or layer directly, or intervening elements or layers may be present. On the contrary, when an element is described as "being directly on", "being directly adjacent to", "being directly connected to" or "being directly coupled to" another element or layer, there are no intervening elements or layers. It should be understood that although terms such as first and second may be used to describe various elements, components, regions, layers, doped types and/or sections, these elements, components, regions, layers, doped types and/or sections should not be limited by these terms. These terms are only used to distinguish one element, component, region, layer, doped type or section from another element, component, region, layer, doped type or section. Thus, a first element, component, region, layer, doped type or section discussed below may be termed a second element, component, region, layer or section without departing from the teachings of the present application. For example, the first chip may become the second chip; and similarly, the second chip may become the first chip. The first chip and the second chip are different chips.

Spatial relationship terms such as "under", "beneath", "lower", "below", "above", and "upper" can be used herein to describe the relationship shown in the figure between one element or feature and another element or feature. It should be understood that in addition to the orientations shown in the figure, the spatial relationship terms further include different orientations of used and operated devices. For example, if a device in the accompanying drawings is turned over and described as being "beneath another element", "below it", or "under it", the device or feature is oriented "on" the another element or feature. Therefore, the exemplary terms "beneath" and "under" may include two orientations of above and below. In addition, the device may further include other orientations (for example, a rotation by 90 degrees or other orientations), and the spatial description used herein is interpreted accordingly.

In this specification, the singular forms of "a", "an" and "the" may also include plural forms, unless clearly indicated otherwise. It should also be understood that terms "include" and/or "comprise", when used in this specification, may determine the presence of features, integers, steps, operations, elements and/or components, but do not exclude the presence or addition of one or more other features, integers, steps, operations, elements, components and/or groups. In this case, in this specification, the term "and/or" includes any and all combinations of related listed items.

Embodiments of the present application are described herein with reference to cross-sectional illustrations that are schematic diagrams of idealized embodiments (and intermediate structures) of the present application, such that variations shown in the shapes can be contemplated due to, for example, manufacturing techniques and/or tolerances. Therefore, the embodiments of the present application should not be limited to the specific shapes of the regions shown herein, but include shape deviations due to, for example, manufacturing technologies. Therefore, the regions shown in the figure are schematic in nature, and their shapes are not intended to show the actual shapes of the regions of the device and limit the scope of the present application.

Figure 1:
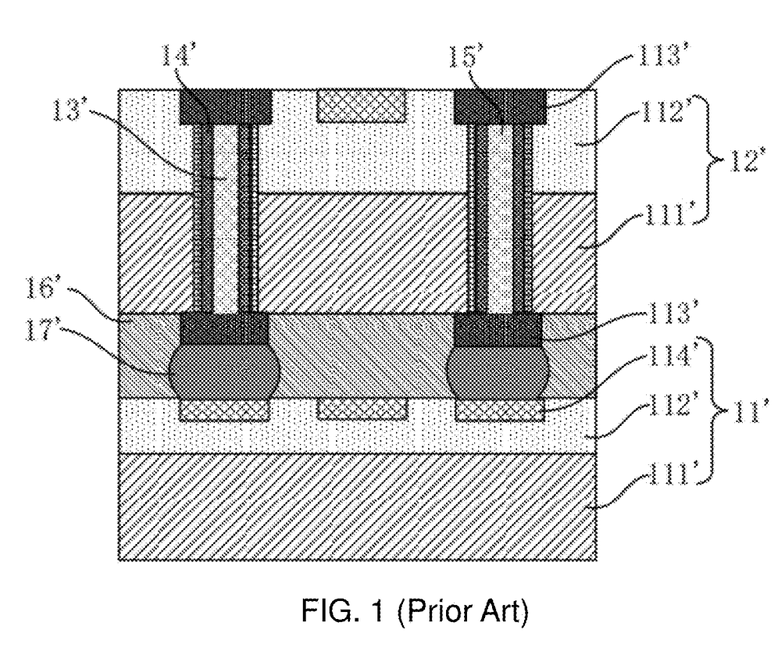
FIG. 1 is a schematic sectional view of a semiconductor structure.

FIG. 1 shows a conventional semiconductor structure. The conventional semiconductor structure includes a stacked structure, a TSV 13', an insulating layer 14' and a conductive layer 15'. The stacked structure includes a first chip 11' and a second chip 12'. The second chip 12' is bonded onto the first chip 11' in an F2F manner through a bonding layer 16'. The first chip 11' and the second chip 12' each include a substrate 111', a dielectric layer 112' on the substrate 111' and a metal layer 113' in the dielectric layer 112'. The TSV 13' penetrates through the substrate 111' of the second chip 12' and the dielectric layer 112' of the second chip 12'. The insulating layer 14' is located on a sidewall of a first part 131'. The conductive layer 15' is located in the TSV 13' and fills up the TSV 13'. The conductive layer 15' is electrically connected to the penetrated metal layer 113' in each of the first chip 11' and the second chip 12'. However, as the TSV 13' is only located in the second chip 12' in the conventional semiconductor structure shown in FIG. 1, there is a need for an additional solder ball 17' to establish the metal interconnection, and thus the manufacturing process is complicated.

Figure 2:
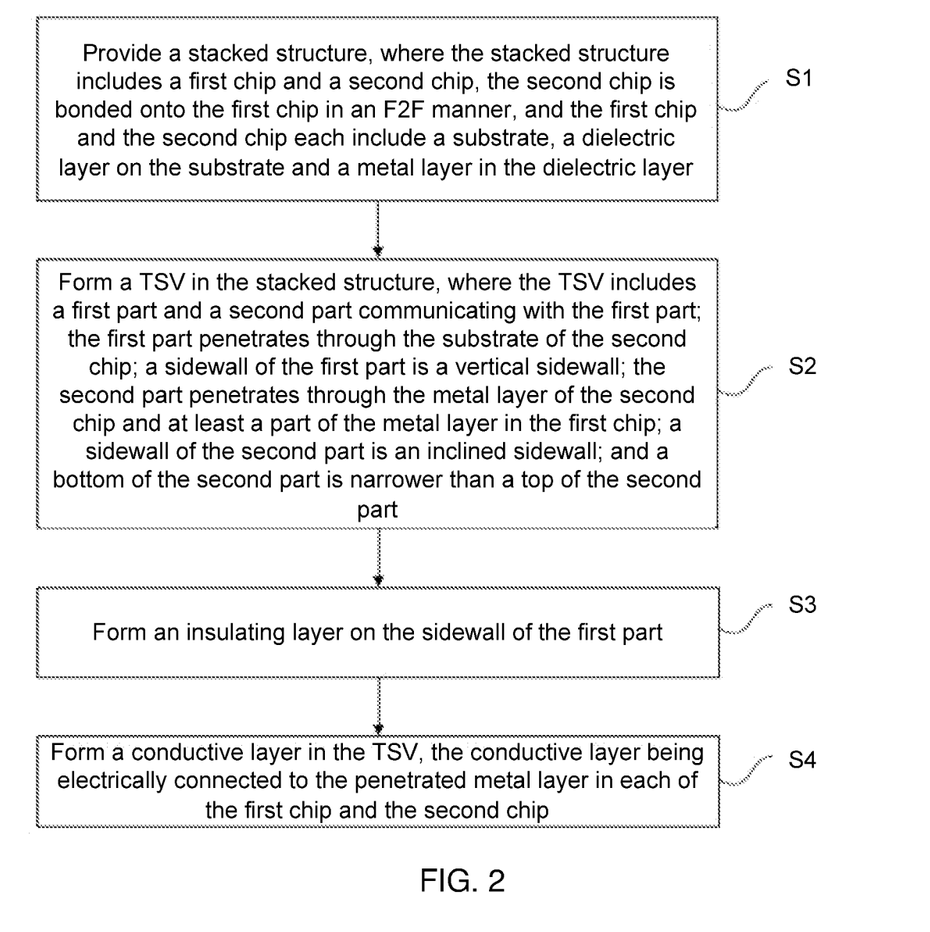
FIG. 2 is a flowchart of a manufacturing method of a semiconductor structure according to an embodiment of the present application.

Referring to FIG. 2, the present application provides a manufacturing method of a semiconductor structure, including the following steps:

S1: Provide a stacked structure, where the stacked structure includes a first chip and a second chip, the second chip is bonded onto the first chip in an F2F manner, and the first chip and the second chip each include a substrate, a dielectric layer on the substrate and a metal layer in the dielectric layer.

S2: Form a TSV in the stacked structure, where the TSV includes a first part and a second part communicating with the first part; the first part penetrates through the substrate of the second chip; a sidewall of the first part is a vertical sidewall; the second part penetrates through the metal layer of the second chip and at least a part of the metal layer in the first chip; a sidewall of the second part is an inclined sidewall; and a bottom of the second part is narrower than a top of the second part.

S3: Form an insulating layer on the sidewall of the first part.

S4: Form a conductive layer in the TSV, the conductive layer being electrically connected to the penetrated metal layer in each of the first chip and the second chip.

By forming the TSV penetrating through the second chip and a part of the first chip, and forming the conductive layer in the TSV, the manufacturing method of a semiconductor structure in the present application can implement electrical connection between the metal layers in the first chip and the second chip without an additional conductive structure, and thus can simplify the semiconductor structure and the process steps. With the inclined sidewall of the second part, the manufacturing method only forms the insulating layer on the sidewall of the first part to simplify the process steps and reduce the cost. In addition, by bonding the second chip onto the first chip in the F2F manner, the structure obtained further has the advantages of the high precision, small size of the stacked structure, high input/output (I/O) density, short interconnecting line, small parasitic parameter of the lead, etc.

Optionally, the bonding between the first chip and the second chip may be implemented with wafer level packaging (WLP) such as wafer on wafer (WOW) or chip on wafer (COW), and may also be implemented with chip scale package (CSP).

Optionally, in a manufacturing method provided by some embodiments, the sidewall of the second part may have an inclination angle of 60-80° with respect to a surface of the substrate, such as 60°, 65°, 70°, 75° or 80°. In a manufacturing method provided by some embodiments, the TSV may have a depth of 50-100 μm, such as 50 μm, 65 μm, 80 μm or 100 μm. In a manufacturing method provided by some embodiments, the TSV may have a width of 2-10 μm, such as 2 μm, 4 μm, 6 μm, 8 μm or 10 μm. In the manufacturing method of a semiconductor structure provided by the present application, there are no limits made on the specific inclination angle of the sidewall of the second part with respect to the surface of the substrate, the specific depth of the TSV and the specific width of the TSV.

Figure 3:
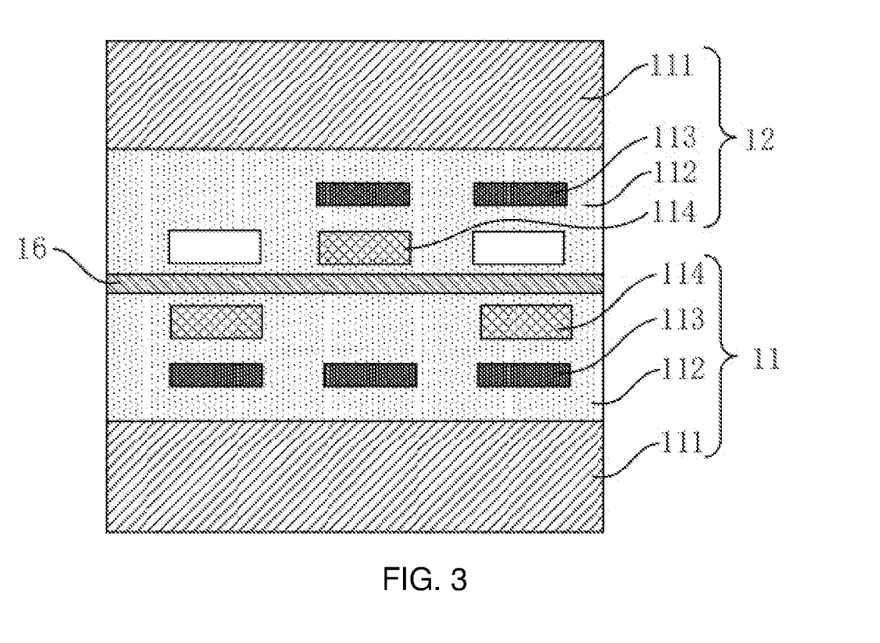
FIG. 3 is a schematic sectional view of a structure obtained in Step S1 in a manufacturing method of a semiconductor structure according to an embodiment of the present application.

In Step S1, referring to S1 in FIG. 2 and FIG. 3, a stacked structure is provided. The stacked structure includes a first chip 11 and a second chip 12. The second chip 12 is bonded onto the first chip 11 in an F2F manner. The first chip 11 and the second chip 12 each include a substrate 111, a dielectric layer 112 on the substrate 111 and a metal layer 113 in the dielectric layer 112.

Referring also to FIG. 3, in an embodiment, Step S1 may include the following steps:

Provide the first chip 11.

Provide the second chip 12, and bond the second chip 12 onto the first chip 11 in the F2F manner.

In an embodiment, the substrate 111 may include, but is not limited to, a silicon substrate, a silicon nitride substrate or a silicon oxynitride substrate. The dielectric layer 112 may include, but is not limited to, a silicon dioxide layer or a silicon nitride layer. There are no limits made on the material of the substrate 111 and the dielectric layer 112 in the present application.

Specifically, the dielectric layer 112 may be located at a front side of the substrate 111. The so-called term "F2F" means that after the second chip 12 is bonded onto the first chip 11, the dielectric layer 112 of the second chip 12 and the dielectric layer 112 of the first chip 11 are bonded together, as shown in FIG. 3. It can be considered that the front side of the first chip 11 is upward, and the second chip 12 with the downward front side is bonded onto the first chip 11.

Referring also to FIG. 3, in an embodiment, the first chip 11 and the second chip 12 each may further include a pad 114. The pad 114 is located at a side of the metal layer 113 away from the substrate 111. In the above embodiment, the TSV 13 further penetrates through the pad 114 in the first chip 11 and the pad 114 in the second chip 12.

In an embodiment, a through via (not shown) may be reserved in the metal layer 113 and the pad 114 separately. The through via corresponds to the subsequent TSV 13 and becomes a part of the TSV 13 upon formation of the TSV 13.

According to the manufacturing method of a semiconductor structure provided by the above embodiment, the through via is reserved in the metal layer 113 and the pad 114 separately. The reserved through via is filled with the dielectric layer 112 when the dielectric layer 112 covering the metal layer 113 and the pad 114 is formed. Consequently, during the subsequent formation of the TSV 13, the etching step upon the etching of the substrate 111 is to etch the dielectric layer 112, rather than to alternately etch the dielectric layer 112 and the metal layer 113 or the pad 114, thus simplifying the process steps and improving the production efficiency.

Optionally, the pad 114 may include, but is not limited to, a copper pad. There are no limits made on the material of the pad 114 in the present application.

Figure 4:
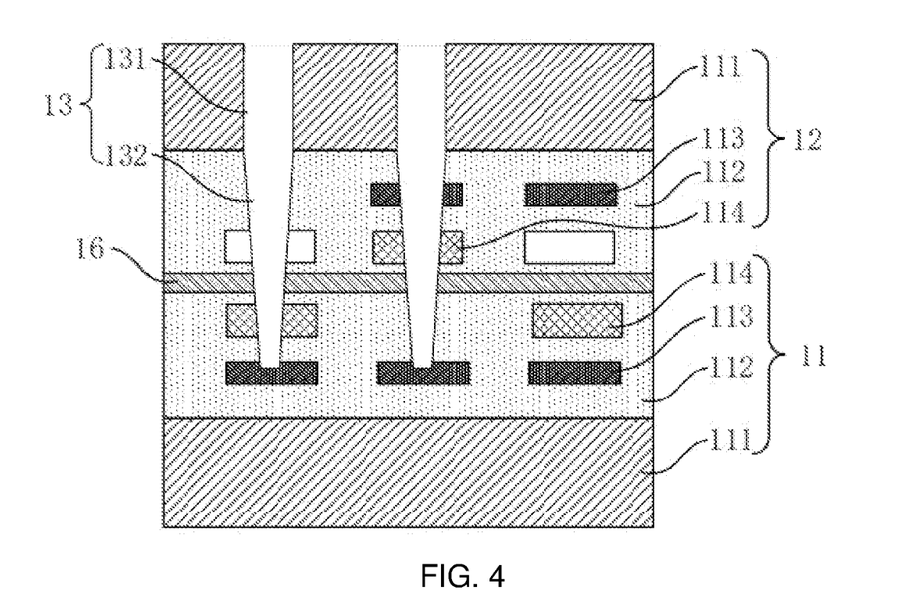
FIG. 4 is a schematic sectional view of a structure obtained in Step S2 in a manufacturing method of a semiconductor structure according to an embodiment of the present application.

In Step S2, referring to S2 in FIG. 2 and FIG. 4, a TSV 13 is formed in the stacked structure. The TSV 13 includes a first part 131 and a second part 132 communicating with the first part 131. The first part 131 penetrates through the substrate 111 of the second chip 12. A sidewall of the first part 131 is a vertical sidewall. The second part 132 penetrates through the metal layer 113 of the second chip 12 and at least a part of the metal layer 113 in the first chip 11. A sidewall of the second part 132 is an inclined sidewall. A bottom of the second part 132 is narrower than a top of the second part 132.

Referring also to FIG. 4, in an embodiment, Step S2 may include the following step:

Etch the first chip 11 and the second chip 12 to form the TSV 13.

Referring to FIG. 4, in an embodiment, the second chip 12 may be bonded onto the first chip 11 through a bonding layer 16. In the above embodiment, the TSV 13 may further penetrate through the bonding layer 16.

In an embodiment, the bonding layer 16 may include, but is not limited to, an aluminum/copper composite layer. There are no limits made on the material and structure of the bonding layer 16 in the present application.

Due to a high-temperature working environment, the stable performance of the system is restricted by the conventional aluminum wire. The copper metal has the advantages of better thermal conductivity, better electrical conductivity and lower thermal expansion coefficient than the aluminum metal, but copper wire bonding is hardly applied to the semiconductors. The manufacturing method of a semiconductor structure provided by the above embodiment takes the aluminum/copper composite layer as the bonding layer 16, in which the aluminum metal can provide the desirable bonding, while the copper metal can provide the desirable electrical, mechanical and thermal properties.

In an embodiment, in the step of etching the first chip 11 and the second chip 12 to form the TSV 13, dry etching may be used to etch the first chip 11 and the second chip 12 to form the TSV 13.

In an embodiment, after the dry etching is used to etch the first chip 11 and the second chip 12 to form the TSV 13, the stacked structure may further be etched with wet etching to widen the TSV 13, thus fully exposing the pad 114 in each of the first chip 11 and the second chip 12.

In Step S3, referring to S3 in FIG. 2 and FIGS. 5-7, an insulating layer 14 is formed on the sidewall of the first part 131.

Figure 5:
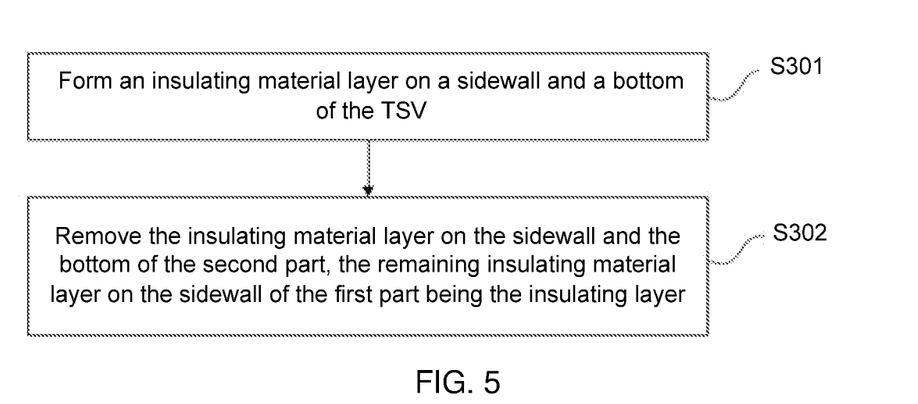
FIG. 5 is a flowchart of Step S3 in a manufacturing method of a semiconductor structure according to an embodiment of the present application.
Figure 6:
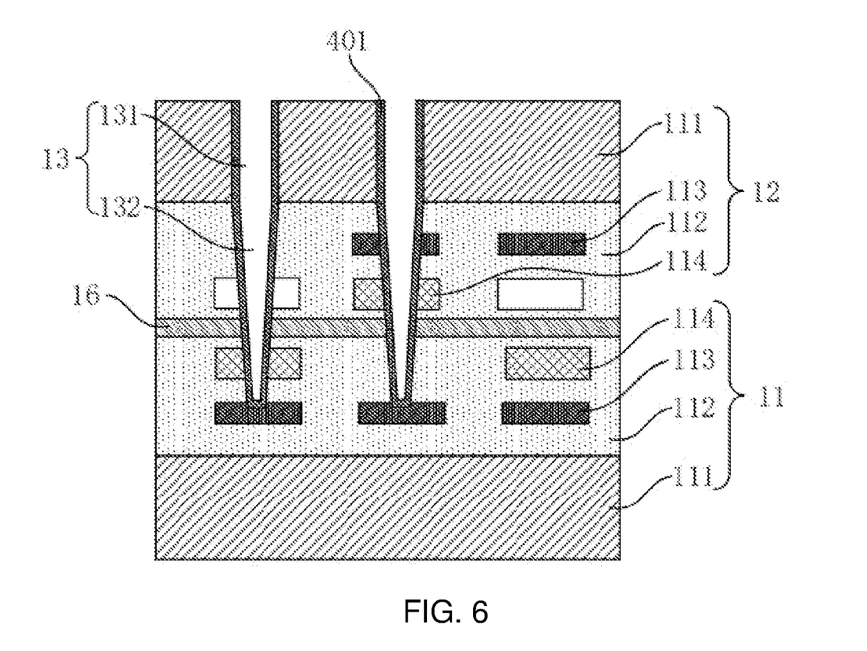
FIG. 6 is a schematic sectional view of a structure obtained in Step S301 in a manufacturing method of a semiconductor structure according to an embodiment of the present application.

As shown in FIG. 5, in an embodiment, Step S3 may include the following steps:

S301: Form an insulating material layer 401 on a sidewall and a bottom of the TSV 13, as shown in FIG. 6.

S302: Remove the insulating material layer 401 on the sidewall and the bottom of the second part 132, the remaining insulating material layer 401 on the sidewall of the first part 131 being the insulating layer 14, as shown in FIG. 7.

According to the manufacturing method of a semiconductor structure provided by the above embodiment, with the inclined sidewall of the second part, the insulating material layer on the sidewall and the bottom of the second part can be removed directly, and the insulating layer is only formed on the sidewall of the first part. Therefore, the structure obtained can directly form electrical connection between the metal layers in the first chip and the second chip through the conductive layer in the TSV without an additional solder ball or distribution line, thus simplifying the process steps and reducing the cost.

In an embodiment, the insulating material layer 401 may include, but is not limited to, an oxide layer. There are no limits made on the material and structure of the insulating material layer 401 in the present application.

Figure 7:
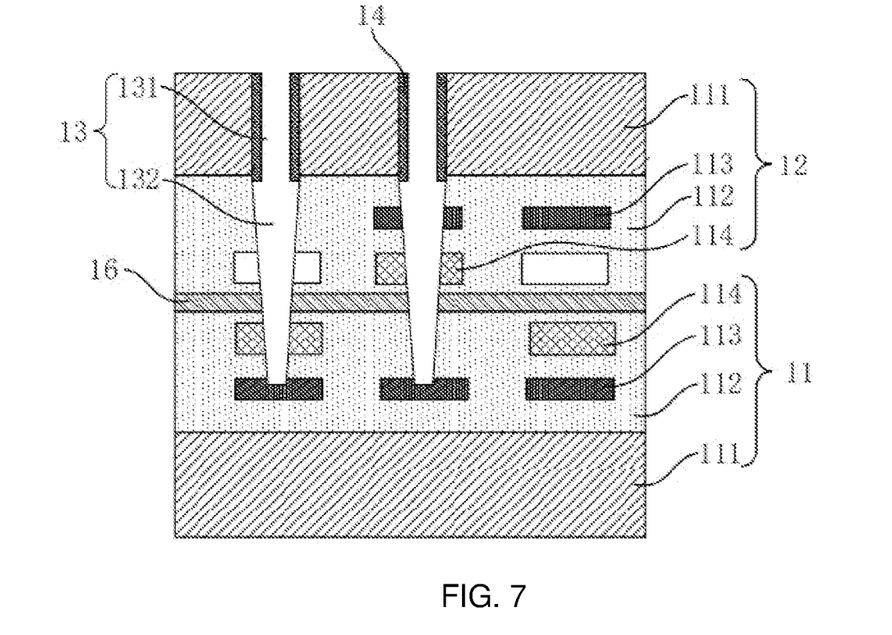
FIG. 7 is a schematic sectional view of a structure obtained in Step S302 and also a schematic sectional view of a structure obtained in Step S3 in a manufacturing method of a semiconductor structure according to an embodiment of the present application.

In Step S302, referring to S302 in FIG. 5 and FIG. 7, the insulating material layer 401 on the sidewall and the bottom of the second part 132 is removed, the remaining insulating material layer 401 on the sidewall of the first part 131 being the insulating layer 14.

In an embodiment, the insulating material layer 401 on the sidewall and the bottom of the second part 132 may be removed with, but not limited to, the dry etching.

In an embodiment, after Step S302, the stacked structure may further be etched with the wet etching to widen the TSV 13, thus fully exposing the pad 114 in each of the first chip 11 and the second chip 12.

Figure 8:
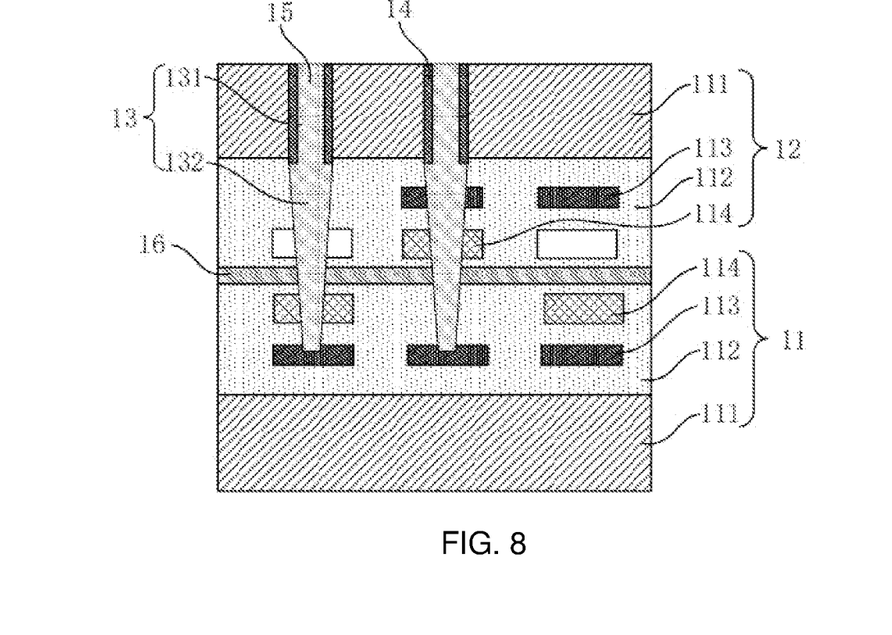
FIG. 8 is a schematic sectional view of a structure obtained in Step S4 in a manufacturing method of a semiconductor structure according to an embodiment of the present application, and also a schematic structural view of a semiconductor structure according to another embodiment of the present application.
Figure 9:
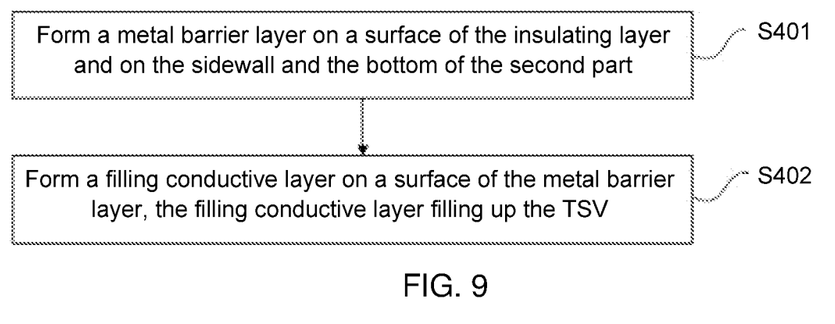
FIG. 9 is a flowchart of Step S4 in a manufacturing method of a semiconductor structure according to an embodiment of the present application.

In Step S4, referring to S4 in FIG. 2 and FIGS. 8-9, a conductive layer 15 is formed in the TSV 13. The conductive layer 15 is electrically connected to the penetrated metal layer 113 in each of the first chip 11 and the second chip 12.

As shown in FIG. 9, in an embodiment, Step S4 may further include the following steps:

S401: Form a metal barrier layer on a surface of the insulating layer 14 and on the sidewall and the bottom of the second part 132.

S402: Form a filling conductive layer 15 on a surface of the metal barrier layer, the filling conductive layer 15 filling up the TSV 13.

It should be understood that although the steps in the flowcharts of FIG. 2, FIG. 5 and FIG. 9 are shown in sequence according to the arrows, these steps are unnecessarily executed in the sequence indicated by the arrows. The execution order of these steps is not strictly limited, and these steps may be executed in other orders, unless clearly described otherwise. Moreover, at least one of the steps in FIG. 2, FIG. 5 and FIG. 9 may include a plurality of steps or stages. The steps or stages are unnecessarily executed at the same time, but may be executed at different times. The execution order of the steps or stages is unnecessarily carried out sequentially, but may be executed alternately with other steps or at least one of the steps or stages of other steps.

Referring also to FIG. 8, the present application further provides a semiconductor structure, including a stacked structure, a TSV 13, an insulating layer 14 and a conductive layer 15. The stacked structure includes a first chip 11 and a second chip 12. The second chip 12 is bonded onto the first chip 11 in an F2F manner. The first chip 11 and the second chip 12 each include a substrate 111, a dielectric layer 112 on the substrate 111 and a metal layer 113 in the dielectric layer 112. The TSV 13 includes a first part 131 and a second part 132 communicating with the first part 131. The first part 131 penetrates through the substrate 111 of the second chip 12. A sidewall of the first part 131 is a vertical sidewall. The second part 132 penetrates through the metal layer 113 of the second chip 12 and at least a part of the metal layer 113 in the first chip 11. A sidewall of the second part 132 is an inclined sidewall. A bottom of the second part 132 is narrower than a top of the second part 132. The insulating layer 14 is located on the sidewall of the first part 131. The conductive layer 15 is located in the TSV 13 and fills up the TSV 13. The conductive layer 15 is electrically connected to the penetrated metal layer 113 in each of the first chip 11 and the second chip 12.

With the TSV penetrating through the second chip and a part of the first chip, and the conductive layer in the TSV, the semiconductor structure in the present application can implement electrical connection between the metal layers in the first chip and the second chip without an additional conductive structure, and thus the semiconductor structure and the process steps can be simplified. With the inclined sidewall of the second part, the semiconductor only forms the insulating layer on the sidewall of the first part to simplify the process steps and reduce the cost.

In an embodiment, the substrate 111 may include, but is not limited to, a silicon substrate, a sapphire substrate, a silicon nitride substrate or a silicon oxynitride substrate. The dielectric layer 112 may include, but is not limited to, a silicon dioxide layer or a silicon nitride layer. There are no limits made on the material of the substrate 111 and the dielectric layer 112 in the present application.

Referring also to FIG. 8, in an embodiment, the first chip 11 and the second chip 12 each may further include a pad 114. Specifically, the pad 114 may be located at a side of the metal layer 113 away from the substrate 111. The pad 114 may include, but is not limited to, a copper pad. There are no limits made on the material of the pad 114 in the present application.

On the basis of the above embodiment, the TSV 13 further penetrates through the pad 114 in the first chip 11 and the pad 114 in the second chip 12.

Optionally, in a semiconductor structure provided by some embodiments, the sidewall of the second part may have an inclination angle of 60-80° with respect to a surface of the substrate, such as 60°, 65, 70°, 75° or 80°. In a semiconductor structure provided by some embodiments, the TSV may have a depth of 50-100 μm, such as 50 μm, 65 μm, 80 μm or 100 μm. In a semiconductor structure provided by some embodiments, the TSV may have a width of 2-10 μm, such as 2 μm, 4 μm, 6 μm, 8 μm or 10 μm. In the semiconductor structure provided by the present application, there are no limits made on the specific inclination angle of the sidewall of the second part with respect to the surface of the substrate, the specific depth of the TSV and the specific width of the TSV.

Referring also to FIG. 8, in an embodiment, the semiconductor structure may further include a bonding layer 16. Specifically, the bonding layer 16 is located between the first chip 11 and the second chip 12, and contacts the dielectric layer 112 of the first chip 11 and the dielectric layer 112 of the second chip 12. The bonding layer 16 may include, but is not limited to, an aluminum/copper composite layer. There are no limits made on the material and structure of the bonding layer 16 in the present application.

Due to a high-temperature working environment, the stable performance of the system is restricted by the conventional aluminum wire. The copper metal has the advantages of better thermal conductivity, better electrical conductivity and lower thermal expansion coefficient than the aluminum metal, but copper wire bonding is hardly applied to the semiconductors. The manufacturing method of a semiconductor structure provided by the above embodiment takes the aluminum/copper composite layer as the bonding layer 16, in which the aluminum metal can provide the desirable bonding, while the copper metal can provide the desirable electrical, mechanical and thermal properties.

In an embodiment, the conductive layer 15 may include a metal barrier layer and a filling conductive layer. The metal barrier layer is located on a surface of the insulating layer and on the sidewall and the bottom of the second part. The filling conductive layer is located on a surface of the metal barrier layer and fills up the TSV 13.

In an embodiment, the metal barrier layer may include, but is not limited to, a tantalum layer, and a metal barrier layer made of other materials or a stacked structure thereof. There are no limits made on the material and form of the metal barrier layer.

In an embodiment, the insulating layer 14 may include, but is not limited to, a pad oxide layer.

Specifically, in some embodiments, the pad oxide layer may include, but is not limited to, a silicon dioxide layer or other oxide layers. There are no limits made on the structure and material of the pad oxide layer.

The technical features of the foregoing embodiments may be combined freely. For simplicity of the description, all possible combinations of all technical features in the embodiments may not be described. However, these combinations of technical features should fall within the scope of the disclosure in the specification if there is no conflict.

Only several embodiments of the present application are described in detail above, but they should not therefore be construed as limiting the scope of the present application. It should be noted that those of ordinary skill in the art can further make variations and improvements without departing from the conception of the present application. These variations and improvements all fall within the protection scope of the present application. Therefore, the protection scope of the present application should be subject to the appended claims.

The invention claimed is:

1. A manufacturing method of a semiconductor structure, comprising:
   providing a stacked structure, wherein the stacked structure comprises a first chip and a second chip, the second chip is bonded onto the first chip in a face-to-face (F2F) manner, and the first chip and the second chip each comprise a substrate, a dielectric layer on the substrate and a metal layer in the dielectric layer;
   forming a through silicon via (TSV) in the stacked structure, wherein the TSV comprises a first part and a second part communicating with the first part; the first part penetrates through the substrate of the second chip; a sidewall of the first part is a vertical sidewall; the second part penetrates through the metal layer of the second chip and at least a part of the metal layer of the first chip; a sidewall of the second part is an inclined sidewall having a non-infinite slope from a top of the second part to a bottom of the second part; and a bottom of the second part is narrower than a top of the second part;
   forming an insulating layer on the sidewall of the first part; and
   forming a conductive layer in the TSV, the conductive layer being electrically connected to the penetrated metal layer in each of the first chip and the second chip.

2. The manufacturing method according to claim 1, wherein the first chip and the second chip each further comprise a pad, the pad is located at a side of the metal layer away from the substrate, and the TSV further penetrates through the pad of the first chip and the pad of the second chip.

3. The manufacturing method according to claim 1, wherein the forming an insulating layer on the sidewall of the first part comprises:
   forming an insulating material layer on a sidewall and a bottom of the TSV; and
   removing the insulating material layer on the sidewall and the bottom of the second part with dry etching, the remaining insulating material layer on the sidewall of the first part being the insulating layer.

4. The manufacturing method according to claim 1, wherein the sidewall of the second part has an inclination angle of 60-80° with respect to a surface of the substrate.

5. The manufacturing method according to claim 1, wherein the TSV has a depth of 50-100 μm and a width of 2-10 μm.

6. The manufacturing method according to claim 1, wherein the providing a stacked structure comprises:
   providing the first chip; and
   providing the second chip, and bonding the second chip onto the first chip in the F2F manner; and
   the forming a TSV in the stacked structure comprises:
   etching the first chip and the second chip by an etching process to form the TSV.

7. The manufacturing method according to claim 6, wherein the second chip is bonded onto the first chip through a bonding layer; and the TSV further penetrates through the bonding layer.

8. The manufacturing method according to claim 1, wherein the forming a conductive layer in the TSV comprises:
   forming a metal barrier layer on a surface of the insulating layer and on the sidewall and the bottom of the second part; and
   forming a filling conductive layer on a surface of the metal barrier layer, the filling conductive layer filling up the TSV.

9. A semiconductor structure, comprising:
   a stacked structure, wherein the stacked structure comprises a first chip and a second chip, the second chip is bonded onto the first chip in a face-to-face (F2F) manner, and the first chip and the second chip each comprise a substrate, a dielectric layer on the substrate and a metal layer in the dielectric layer;

a through silicon via (TSV), wherein the TSV comprises a first part and a second part communicating with the first part; the first part penetrates through the substrate of the second chip;

a sidewall of the first part is a vertical sidewall; the second part penetrates through the metal layer of the second chip and at least a part of the metal layer of the first chip; a sidewall of the second part is an inclined sidewall having a non-infinite slope from a top of the second part to a bottom of the second part; and a bottom of the second part is narrower than a top of the second part;

an insulating layer, located on the sidewall of the first part; and a conductive layer, located in the TSV and filling up the TSV, the conductive layer being electrically connected to the penetrated metal layer in each of the first chip and the second chip.

10. The semiconductor structure according to claim 9, wherein the first chip and the second chip each further comprise a pad, the pad is located at a side of the metal layer away from the substrate, and the TSV further penetrates through the pad of the first chip and the pad of the second chip.

11. The semiconductor structure according to claim 9, wherein the sidewall of the second part has an inclination angle of 60-80° with respect to a surface of the substrate.

12. The semiconductor structure according to claim 10, wherein the TSV has a depth of 50-100 μm and a width of 2-10 μm.

13. The semiconductor structure according to claim 9, wherein, the semiconductor structure further comprises: a bonding layer, located between the first chip and the second chip, and contacting the dielectric layer of the first chip and the dielectric layer of the second chip.

14. The semiconductor structure according to claim 9, wherein the conductive layer comprises:

a metal barrier layer, located on a surface of the insulating layer and on the sidewall and the bottom of the second part; and a filling conductive layer, located on a surface of the metal barrier layer and filling up the TSV.

15. The semiconductor structure according to claim 14, wherein the metal barrier layer comprises a tantalum layer, and the insulating layer comprises a pad oxide layer.

* * * * *